United States Patent

[11] 3,626,256

[72] Inventor Verne R. Brown
Ann Arbor, Mich.
[21] Appl. No. 81,409
[22] Filed Oct. 16, 1970
[45] Patented Dec. 7, 1971
[73] Assignee Transidyne General Corporation
Ann Arbor, Mich.

[54] THIN FILM SEMICONDUCTOR STRAIN GAUGES AND METHOD FOR MAKING SAME
17 Claims, 5 Drawing Figs.

[52] U.S. Cl. .......... 317/234, 317/235, 29/576
[51] Int. Cl. .......... H01l 5/00
[50] Field of Search .......... 317/234, 235

[56] References Cited

UNITED STATES PATENTS

| | | | |
|---|---|---|---|
| 3,084,300 | 4/1963 | Sanchez | 338/2 |
| 3,089,108 | 5/1963 | Gong et al. | 338/2 |
| 3,186,217 | 6/1965 | Pfann | 73/88.5 |
| 3,236,957 | 2/1966 | Karmann et al. | 179/110 |
| 3,417,361 | 12/1968 | Heller et al. | 338/42 |
| 3,440,873 | 4/1969 | Eichelberger | 73/141 |
| 3,446,974 | 5/1969 | Seiwatz | 250/211 |
| 3,456,226 | 7/1969 | Vick | 338/2 |

*Primary Examiner*—James D. Kallam
*Attorney*—Barnard, McGlynn & Reising

ABSTRACT: The strain gauge of this invention comprises a film of a high temperature resistant electrically insulative organic resin, specifically polyimide resin, having deposited thereon a piezoresistive semiconductor thin film with electrical leads bonded to the semiconductor film, and a coating of high heat resistant electrically insulative resin over the semiconductor film. Further in accordance with the preferred embodiment of the invention, such a strain gauge is manufactured by depositing the film of heat resistant organic onto a plate of ceramic, preferably aluminum oxide ceramic, sequentially depositing first the semiconductor film and then the electrical leads onto the organic resin and thereafter applying the coating of heat resistant organic resin over the deposited film of semiconductor. As the last step in manufacture suitable electrically insulated metal wires are soldered or otherwise bonded to exposed portions of the deposited electrical leads. Prior to use the strain gauge, i.e. the film of organic resin having the resin coated semiconductor film and electrical leads with associated wires thereon, can be easily peeled from the ceramic plate and suitably bonded to the structural member which is to be measured for strain.

PATENTED DEC 7 1971 3,626,256

INVENTOR
Verne R. Brown
BY
Barnard, McGlynn & Reising
ATTORNEYS

THIN FILM SEMICONDUCTOR STRAIN GAUGES AND METHOD FOR MAKING SAME

This invention relates to a new and improved strain gauge, and method of manufacture, wherein the strain measuring component comprises a thin film of piezoresistive semiconductor material deposited on a film of heat resistant organic resin which film of organic resin can be easily and simply bonded to the structural member to be measured for strain.

At the present state of the art strain gauges incorporate as the strain sensitive component a grid or network of metal or metal alloys either in the form of filaments or in the form of a coating or foil, affixed to an electrically insulative base which can be secured to the structural member to be measured for strain. Such strain gauges can be manufactured at relatively low cost but have the disadvantage of relatively low sensitivity as compared with the sensitivity which can be attained by the use of a piezoresistive semiconductor material as the strain sensitive component. It is already known to use piezoresistive semiconductor material as the strain sensitive component; however, at the present state of the art strain gauges utilizing a semiconductor material are either comprised of costly brittle, fragile crystalline semiconductors which are fixed by adhesives to the strained member, or they are constructed, on site, onto the strained member by way of vapor deposition, this as distinguished from simply securing to the structural member a preassembled strain gauge assembly. Hence, at the present state of the art there is the choice of either using a relatively inexpensive strain gauge of low sensitivity or of using a semiconductor type gauge in order to accomplish greater sensitivity but at the cost of greatly increased expense and trouble.

It is an object of the present invention to provide a strain gauge which is relatively simple and inexpensive, which can be preassembled and then easily secured to the structural member to be measured for strain, but yet which provides very great sensitivity. Another and attendant object of the invention is the provision of a simple and inexpensive method of manufacturing such strain gauges.

These and other objects, features and advantages of the invention will appear more clearly from the following detailed description of a preferred embodiment thereof made with reference to the drawings in which.

Figure 1:
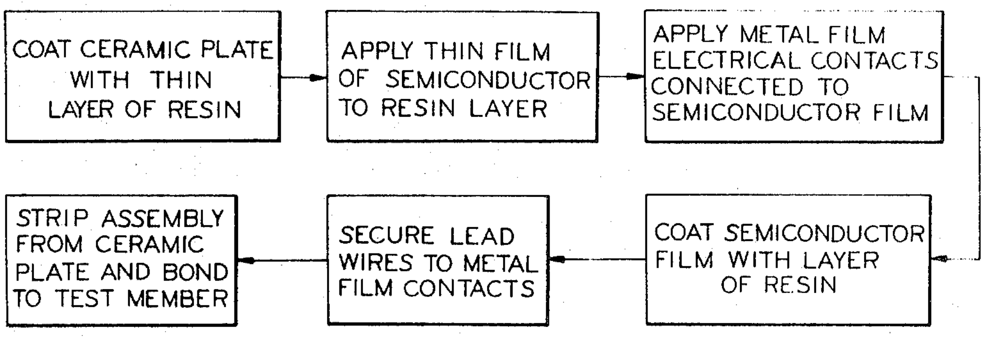
FIG. 1 is a diagram of the method of the present invention.

Referring to FIG. 1, as the first step in the manufacture of strain gauges in accordance with the preferred embodiment of the invention, an alumina ceramic plate is coated on one side thereof with a thin continuous layer of polyimide resin. Polyimide resin is presently available on the market from E. I. DuPont deNemours of Wilmington, Del. and is sold by DuPont under the trademark Pyre-M-L. The layer of polyimide resin should preferably be from about 0.2 to 0.5 mils thickness. To best assure a continuous layer without any pin holes therethrough it is desirable to sequentially apply a plurality of layers to build up to the desired final thickness of from 0.2 to 0.5 mils. After each layer is applied it is cured by heating to about 250° C. for at lest 15 minutes prior to application of the next layer. Typically, three layers, each of about one tenth mil thickness, can be sequentially applied with each layer being cured after application thereof. If desired, the polyimide resin, which is sold in the form of a liquid, can be thinned for the coating operation by addition of a suitable solvent, such as that sold by DuPont under its designation: DuPont Thinner T8585.

Figure 2:
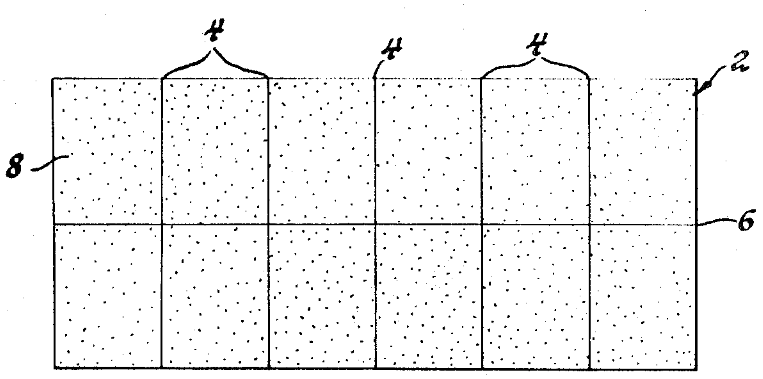
FIG. 2 is a planar view of a scored ceramic substrate plate used in the preferred method of manufacture.

Referring for the moment to FIG. 2, in the preferred method of manufacture an alumina ceramic substrate plate 2 having sets of transverse score lines 4 and 6 is used so a plurality of the strain gauges can be manufactured simultaneously. The ceramic plate is easily frangible along the score lines whereby it can be conveniently subdivided into the smaller plates, all of identical size and rectangular shape and one of which is shown at 8. A can be seen in FIG. 3, upon completion of manufacture each of these small rectangular plates will have affixed thereto one of the strain gauges, the plate only being subdivided to provide the individual stain gauges after completion of manufacture.

Figure 3:
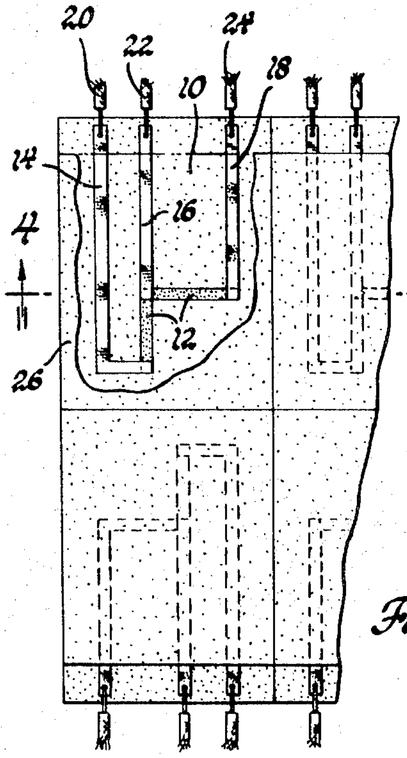
FIG. 3 is a fragmentary planar view in enlarged scale and with parts broken away, of a plurality of strain gauges embodying the present invention at completion of manufacture thereof.
Figure 4:
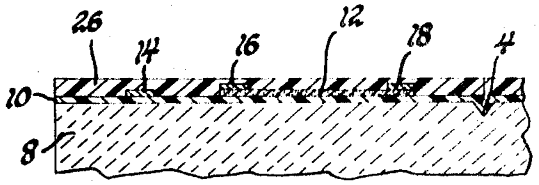
FIG. 4 is a view taken on the line 4—4 of FIG. 3.
Figure 5:
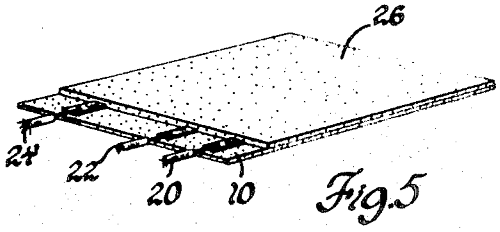
FIG. 5 is a perspective view showing a stain gauge embodying the invention invention just prior to affixing the strain gauge to the structural member to be measured for strain.

After the polyimide resin layer of from about 0.2 to 0.5 mils thickness has been applied to the ceramic plate and cured, as aforesaid, a mask is affixed over the surface of the polyimide resin layer, the mask having openings, one for each of the small rectangular plates 8, the openings defining the shape or pattern desired for the piezoresistive semiconductor film next to be applied. Referring for the moment to FIG. 3, it will be seen that the particular pattern used in the preferred embodiment consists of a pain of mutually perpendicular lines joined at one end. This known configuration is convenient for the assembly of a bridge circuit with a temperature compensating leg.

With the mask affixed, piezoresistive semiconductor material is deposited through the mask and onto the cured polyimide layer to provide a thin film of the semiconductor material and of a pattern determined by the mask. Such deposition can be either by way of vapor deposition in a vacuum, as is well known in the art, or by means of cathode sputtering in an argon atmosphere which provides an argon plasma, such technique also being well know in the art. In general the substrate (the resin coated alumina) must be maintained at elevated temperatures (above 300°C.) during the deposition process in order to assure polycrystalline semiconductor film which will exhibit the piezoresistive behavior. The deposited semiconductor film should have a thickness not exceeding about 5,000 angstroms. Typical examples of piezoresistive semiconductor materials are gallium-doped-germanium, and silicon.

After the thin film of semiconductor has been applied, as aforesaid, the mask is removed and a new mask is affixed, this mask having a set of openings for each of the small rectangular plates for purposes of applying metal film electrical leads. The thickness of the deposited electrical leads is not critical; a thickness of from one-half up to several microns is satisfactory. Any of a large number of metals can be used for the deposited electrical leads, for example, platinum, gold, palladium, chromium, chromium-gold alloy, etc. provided ohmic contact (nonrectifying) is made to the semiconductor film. The electrical leads can be either vapor deposited in a vacuum or deposited by cathode sputtering in an argon atmosphere. The ends of the electrical leads to which the lead wires are to be subsequently soft soldered, spotwelded, or brazed are all adjacent one end of the rectangular layer of polyimide resin on the small rectangular plate 8. This can be seen by reference to FIG. 3.

After the electrical leads have been deposited and the mask removed a layer of polyimide resin is coated over the semiconductor film pattern but not over the ends of electrical leads to which the lead wires are to be affixed. This is accomplished simply by coating each of the small rectangular assemblies over the entire width thereof in that portion which carries the semiconductor film pattern while leaving uncoated the end portion of the rectangular assembly which carries the aforesaid ends of the electrical leads. Here again the polyimide can be applied in the form of a solution thereof in a suitable solvent. The thickness of this coating is not critical. The thickness of from0.2 to 0.5 mils, for example, is satisfactory. After the coating is applied the assembly is heated to cure the resin. As the next step in manufacture, the electrical lead wires are soldered or brazed to the exposed ends of the deposited film electrical leads.

The completed strain gauges affixed to the scored ceramic substrate plate are shown in FIG. 3. The thin polyimide resin layer deposited onto the small rectangular ceramic plate is shown at 10, the thin film piezoresistive semiconductor pattern at 12, the deposited electrical leads at 14, 16 and 18 and the lead wires at 20, 22 and 24.

After manufacture, the small rectangular plates with their attached strain gauge assemblies can be separated from each other simply by breaking the scored ceramic substrate plate along the score lines. This can be done either at the facility where the strain gauges are manufactured or the strain gauges can be shipped to the ultimate user in joined condition leaving it for the user to snap off each of the strain gauges as needed. Prior to use of the strain gauge, and preferably only immediately prior to use, the polyimide layer which is affixed to the ceramic plate is peeled away from the ceramic plate. The ceramic plate can be discarded. Hence, the strain gauge assembly as actually used consists of a thin sheet of resin, preferably from about 0.2 to 0.5 mils total thickness, having the piezoresistive semiconductor material deposited thereon in the form of a thin film pattern and with film metal leads deposited onto the semiconductor material, a layer of resin over the semiconductor film and electrical lead wires secured to the deposited film metal leads. To affix the strain gauge to the member desired to be measured for strain a thin layer of any suitable strain gauge cement or adhesive, such as on epoxy resin adhesive, is applied to the member or to the underside of the strain gauge (i.e. the surface of the thin polyimide layer which was previously affixed to the ceramic plate 8) and the strain gauge assembly then bonded to the member by way of the applied strain gauge cement.

By reason of the extreme thinness of the polyimide resin layer onto which the semiconductor material is deposited, whereby the semiconductor material is positioned extremely close to the member being measured for strain during the strain measurement, and also by reason of the use of the thin film of piezoresistive semiconductor material as the strain measuring element, the strain gauge provides greatly increased sensitivity as compared with conventional stain gauges utilizing metal foil or metal filament elements. Even though the strain gauge with this extremely high sensitivity is relatively fragile, it can nevertheless be shipped and otherwise handled prior to use without extreme care being exercised, this because the ceramic plate to which it is affixed provides rigidity and strength.

The following additional information will be helpful in the practice of the invention.

It is much preferred to use polyimide resin because of its strength and its excellent heat resistance. Polyimide resin can withstand temperatures up to 400° C. even in the vacuum processing environment. Other heat resisting resins can, however, be used. Alumina ceramic is much preferred as the ceramic substrate plate to which the resin is applied because whereas the resin will adhere to the ceramic, the adherence is very weak and hence can subsequently be easily stripped or peeled way from the ceramic. Alumina ceramics are well known in the art and are generally formed of either determined 100° percent aluminum oxide or upwards of about 85 percent by weight aluminum oxide together with silica, alkaline earth metal oxide or the like fluxing ingredients and sometimes with additions of oxides such as chromium carithmetic or manganese oxide as mineralizers. U.S. Pat. No. 2,272,618 is an example of numerous patents and other publications describing alumina ceramic. Plates or substrates of other ceramics or of other materials can be used if desired; however, the ceramic or other material used must, of course, have ample heat resistance to withstand the curing temperature used for the thin film of resin applied, where thermosetting resin is used, and the plate must either be of a material from which the resin can easily be peeled or stripped or it then becomes necessary to apply a film of parting agent to the plate prior to application of the resin.

Keeping in mind that in the use of the strain gauge the underside of the resin film must be bonded to the member to be measured for strain, it is desirable that the resin surface be slightly textured rather than extremely smooth. Since the texture of the resin surface is determined the texture of the surface of the plate to which it is applied, it is desirable that the surface of the plate have a surface finish of about from 40 to 60 micro inches carithmetic average).

One would expect that upon subdividing the ceramic plate along the score lines after manufacture of the strain gauges that the resin, which is continuous across the scored plate, would not separate with the ceramic. However I have suprisingly found that the polyimide resin does separate cleanly along the score lines along with the ceramic. Of course should there be any difficulty in this regard it can be easily corrected by scoring or cutting through the resin along the score lines prior to subdividing the scored plate with its assembled strain gauges thereon.

Whereas I have found it preferable to use polyimide resin as the coating over the semiconductor material, other resins can be used if desired through the resin used must, of course have sufficient heat resistance to withstand the temperature to which the strain gauge is to be exposed. Silicone resin is an example of another resin having very high heat resistance.

It will be understood that while the invention has been described specifically with reference to certain preferred embodiments thereof, various changes may be made all within the full and intended scope of the claims which follow:

The embodiments of the invention in which any exclusive property is claimed and are defined as follows:

1. A strain gauge comprising a film of organic resin having deposited thereon a piezoresistive semiconductor thin film which is of predetermined pattern and which has electrical leads bonded thereto, and a coating of organic resin over said semiconductor film.

2. A strain gauge as set forth in claim 1 wherein each of the electrical leads comprises a metal film of predetermined pattern.

3. A strain gauge as set forth in claim 1 where the film of organic resin is polyimide resin.

4. A strain gauge as set forth in claim 1 wherein both the film of organic resin and the coating of organic resin are polyimide resin.

5. A strain gauge as set forth in claim 1 wherein the film of organic resin has a thickness of about 0.2 to 0.5 mils and wherein the thin film of semiconductor material has a thickness not exceeding about 5,000 angstroms.

6. A strain gauge as set forth in claim 1 wherein the film of organic resin is deposited on a rigid plate from which the resin film can be easily peeled.

7. A stain gauge as set forth in claim 6 wherein said plate is alumina ceramic.

8. A strain gauge assembly asset forth in claim 6 wherein the plate has a surface finish of from about 90 to 60 micro inches (arithmetic average).

9. A strain gauge assembly comprising an alumina ceramic plate having deposited thereon a film of polyimide resin, said film of polyimide resin having deposited thereon a piezoresistive semiconductor thin film which is of predetermined pattern and which has bonded thereto a plurality of metal film electrical leads, and a coating of polyimide resin over said semiconductor film.

10. A method for manufacturing a strain gauge comprising depositing onto a rigid plate a film of organic resin which can subsequently be easily peeled off of said plate, depositing onto said organic resin film a piezoresistive semiconductor thin film of predetermined pattern, depositing onto said semiconductor thin film a plurality of metal film electrical leads, and thereafter coating the semiconductor thin film with a layer of organic resin.

11. A method as set forth in claim 10 wherein said plate is alumina ceramic and said resin film is polyimide resin.

12. A method as set forth in claim 10 wherein said resin film and said resin coating are polyimide resin and wherein said resin film has a thickness of from 0.2 to 0.5 mils.

13. A method as set forth in claim 10 wherein said plate is alumina ceramic and has a surface finish of from about 30 to 60 micro inches (arithmetic average).

14. A method for simultaneously manufacturing a plurality of strain gauges comprising depositing a film of organic resin onto a plate from which the organic resin film can subsequently be easily peeled, depositing onto each of a plurality of elected surface portions of said organic resin film a piezoresistive semiconductor thin film of predetermined pattern, depositing onto each of said semiconductor films a plurality of metal film electrical leads, and coating each of said semiconductor films with a layer of organic resin.

15. A method as set forth in claim 14 wherein said plate is scored for subsequent breakage into a plurality of small plates of predetermined size and shape, each of the portions of the organic resin film deposited onto each of said small plates constituting one of said selected portions of said organic resin film.

16. A method as set forth in claim 15 wherein said resin film is polyimide resin.

17. A method as set forth in claim 15 wherein said plate is alumina ceramic.

* * * * *

UNITED STATES PATENT OFFICE
CERTIFICATE OF CORRECTION

Patent No. 3,626,256 Dated December 7, 1971

Inventor(s) Verne R. Brown

It is certified that error appears in the above-identified patent and that said Letters Patent are hereby corrected as shown below:

Abstract, line 9 after "organic" insert --resin--. Column 1, line 53 "stain" should be --strain--; column 1, line 68 "lest" should be --least--. Column 2, line 8 "A" should be --As--; column 2, line 11 "stain" should be --strain--; column 2, line 22 "pain" should be --pair--. Column 3, line 41 "stain" should be --strain--; column 3, line 50 after "its" insert --excellent--; column 3, line 59 after "either" delete "determined"; column 3, line 60 "100°" should be --100--; column 3, line 65 "carithmetic" should be --oxide--. Column 4, line 5 after "determined" insert --by--; column 4, line 8 "carithmatic" should be --(arithmatic--; column 4, line 13 "suprisingly" should read -- surprisingly --;column 4, line 30 "any" should be --an--; column 4, line 31 after "claimed" delete "and"; column 4, line 53 "stain" should be --strain--; column 4, line 55 "asset" should be --as set--; column 4, line 56 "90" should be --40--. Column 5, line 11 "elected" should be --selected--.

Signed and sealed this 4th day of July 1972.

(SEAL)
Attest:

EDWARD M.FLETCHER, JR.
Attesting Officer

ROBERT GOTTSCHALK
Commissioner of Patents